COMPONENT PARTS PLACEMENT

Filed Dec. 7, 1953 3 Sheets-Sheet 1

Inventor:
Ralph H. Snyder,
by Nathan J. Cornfeld
His Attorney.

Oct. 15, 1957 R. H. SNYDER 2,809,373

COMPONENT PARTS PLACEMENT

Filed Dec. 7, 1953 3 Sheets-Sheet 2

Inventor:
Ralph H. Snyder,
by Nathan J. Cornfeld
His Attorney.

Oct. 15, 1957 R. H. SNYDER 2,809,373

COMPONENT PARTS PLACEMENT

Filed Dec. 7, 1953 3 Sheets-Sheet 3

Inventor:
Ralph H. Snyder,
by Nathan J. Cornfeld
His Attorney.

United States Patent Office 2,809,373

Patented Oct. 15, 1957

2,809,373

COMPONENT PARTS PLACEMENT

Ralph H. Snyder, Schenectady, N. Y., assignor to General Electric Company, a corporation of New York Application December 7, 1953, Serial No. 396,677

16 Claims. (Cl. 1—2)

My invention relates to automatic machinery and pertains more particularly to a novel arrangement for automatically forming and placing electronic components in the manufacture of electronic equipment chassis.

Some electronic components, such as resistors, are formed with wire leads on the ends thereof, whereby the components are adapted for being wired into the chassis of electronic equipment. In the manufacture of such chassis, these electronic components must first have the leads thereof suitably formed for insertion in apertures in the chassis and thereafter must be placed in position and inserted in the proper chassis apertures.

A primary object of my invention is to provide a new and improved arrangement for automatically forming and placing electronic components in the manufacture of electronic equipment chassis.

Another object of my invention is to provide a new and improved automatic arrangement whereby the production of electronic equipment chassis can be increased.

Still another object of my invention is to provide a new and improved automatic component forming and placing arrangement which is adaptable for use with other automatic devices in obtaining complete automation of chassis manufacture.

Further objects and advantages of my invention will become apparent as the following description proceeds and the features of novelty which characterize my invention will be pointed out with particularity in the claims annexed to and forming part of this specification.

In carrying out the objects of my invention I provide a head arranged for moving between component forming and placing positions. An indexing head moves chassis into the placing position seriatim. A stationary die for holding a component to be formed is located at the forming position. The head includes a forming die adapted for cooperating with the stationary die at the forming position for bending the component leads. The head further includes a holder which is moveable relative to the forming die and holds the component in place on the stationary die during forming. After forming the component becomes lodged in the forming die and is carried therein to the placing position at which the bent leads are aligned with apertures in a chassis. Subsequently the holder is actuated relative to the forming die to eject the component for insertion into the chassis apertures.

For a better understanding of my invention reference may be had to the accompanying drawing in which.

Figure 9:
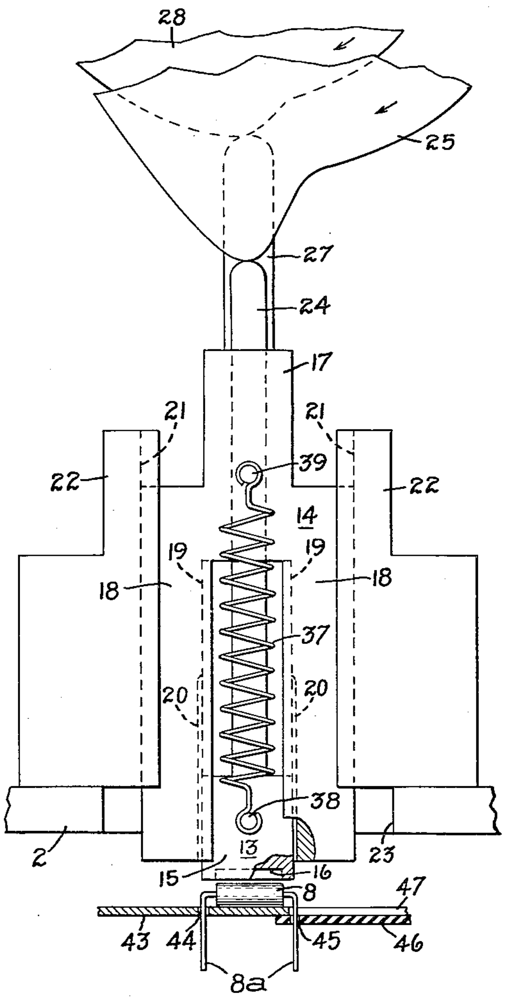

Fg. 8 is another similar view illustrating the relative disposition of parts when the holding member and forming die are actuated and for further illustrating the manner in which the component is lodged in the forming die; and Fig. 9 is still another similar view illustrating the relative disposition of parts when the holding member is actuated for ejecting the component.

Figure 1:
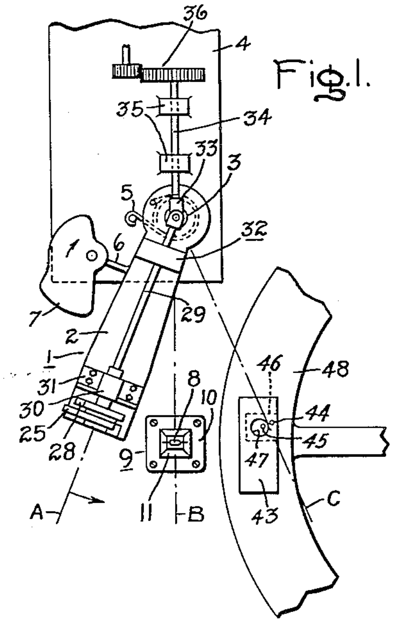
Fig. 1 is a plan view illustrating a preferred embodiment of my invention.

Referring to the drawings I have shown in Fig. 1 a preferred embodiment of my invention including a swinging head generally designated 1. The head 1 includes a base plate 2 which is pivotally mounted at 3 on a stationary frame 4. A torsion spring 5 interconnects the base plate 2 and the frame 4 for biasing the head clockwise in Fig. 1 so as to cause a stud 6 extending laterally from the base 2 to follow a cam 7. The cam 7 is adapted for being rotated clockwise in Fig. 1 by means (not shown) which cooperates with the stud 6 cyclically causing the head 1 to move between and dwell in positions designated A, B, and C.

In position A the head 1 enables unobstructed loading of an electronic component 8 on a stationary die 9 located in position B. As better seen in Fig. 2, the stationary die 9 comprises a base 10 and a die-block 11 having an indentation or cradle 12 formed in the upper surface thereof. The cradle 12 is adapted for receiving the component 8 in the manner shown with the leads of the component designated 8*a* on either end thereof resting on the upper surface of the die block and extending over the side edges.

Figure 3:
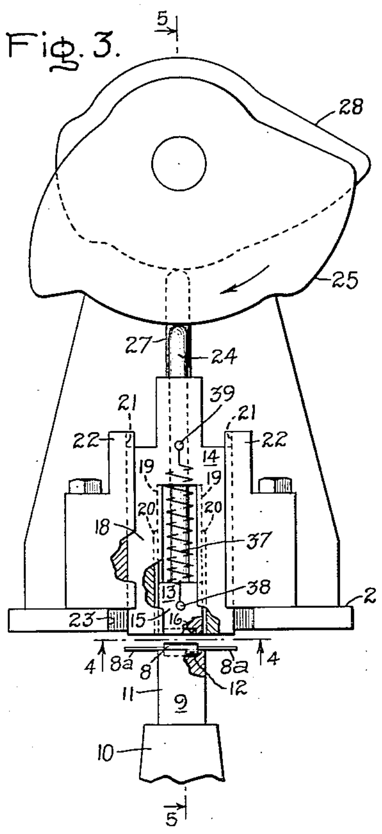
Fig. 3 is an end view of the head.
Figure 4:
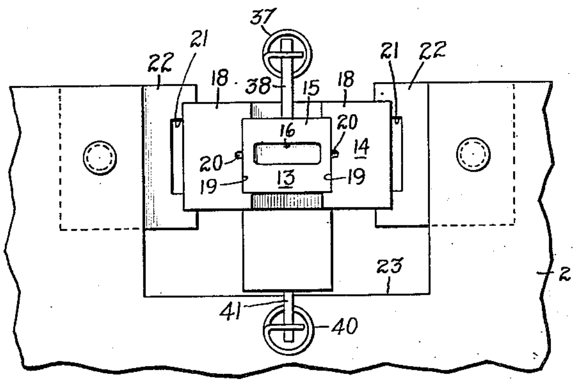
Fig. 4 is an enlarged section taken along the line 4—4 in Fig. 3.
Figure 5:
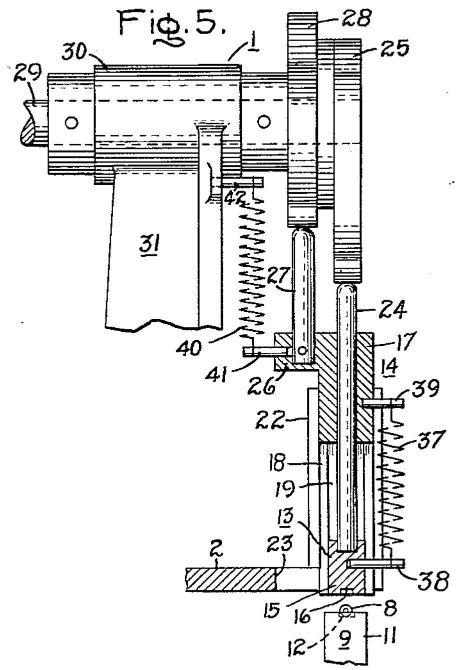
Fig. 5 is a section taken along the line 5—5 in Fig. 3.

Carried by the base plate 2 and adapted for cooperating with the die block 11 in position B are a holder 13 and a forming die 14 arranged to operate on the component 8. As seen in Figs. 3–5, the holder 13 comprises a block 15, having an indentation 16 formed in the underside thereof which corresponds to the indentation 12 in the block 11. The forming die 14 comprises a block 17 formed to include a spaced pair of downwardly extending portions 18. The block 15 is arranged for vertical sliding movement in opposing channels 19 formed in the inner side walls of the portions 18 of the block 17. Formed in the bottoms of the channels 18, for a purpose which will be seen hereinafter, are opposed vertical grooves 20.

The block 17, in turn, is arranged for vertical sliding movement in opposing vertical channels 21 formed in the opposing sidewalls of a spaced pair of guide blocks 22. The guide blocks 22 are suitably secured to the upper surface of the base plate 2 on either side of a suitable cutout 23 in the edge of the base plate opposite the pivot 3.

Figure 2:
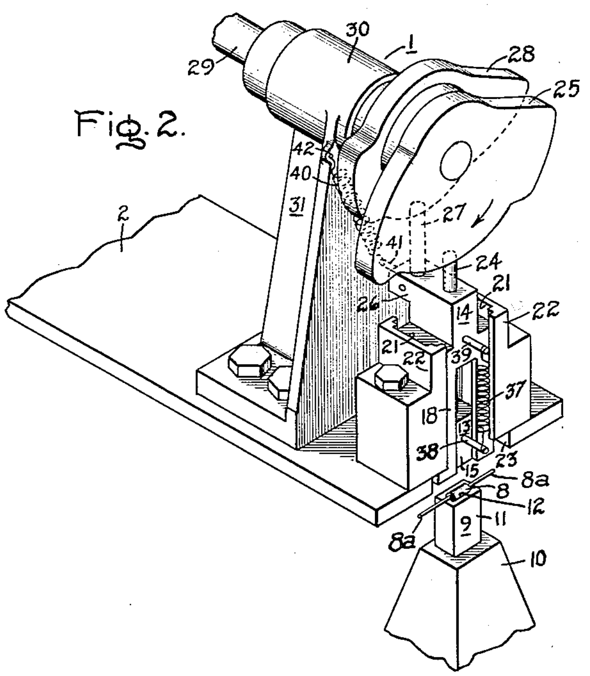
Fig. 2 is a perspective view illustrating the head portion of my invention.

Secured in the upper end of the block 15 is a push rod 24 which extends slidably through a vertical bore in the block 17 for cooperating with a cam 25. Secured in a rearwardly extending portion 26 of the block 17 in the manner shown in Figs. 2 and 5 is another push rod 27 which extends upwardly for cooperating with another cam 28.

The cams 25 and 28 are securely carried on a cam shaft 29 suitably journalled just inwardly of the cam 28 in a journal sleeve 30 formed as part of a standard 31 suitably secured on the upper portion of the base plate 2. As seen in Fig. 1, the opposite end of the cam shaft 29 is similarly supported by another standard 32. The cam shaft 29 is arranged for being driven through a universal joint 33 by a drive shaft 34 journalled in a spaced pair of standards 35 on the stationary frame 4 and driven by suitable driving means, generally designated 36. It will be seen, of course, that the cam shaft 29 can be driven by any one of various commonly known means adapted for driving a shaft journalled on a swinging member.

As best seen in Fig. 5, a coil spring 37 is provided which is connected at one end to a stud 38 fixed in the block 15 at the other end to a similar stud 39 fixed in the block 17. The spring 37 is effective for biasing the block 15 and the push rod 24 upwardly into following engagement with the cam 25. Another coil spring 40 extends between a stud 41 in the extension 26 of the block 17 and a stud 42 fixed in the standard 31 for biasing the block 17 and the push rod 27 upwardly into cam following engagement with the cam 28.

As seen in the various figures of the drawing, rotation of the shaft 29 and the cams 25 and 28 thereon effect relative vertical movement between the block 15 and the block 17 and between the blocks 15 and 17 and the base plate 2. When the head 1 is positioned at B by the cam 7 the various elements comprising the head are in the relative positions thereof over the stationary die 9 shown in Figs. 3 and 5. Thereafter clockwise rotation of the cams 25 and 28 effect downward actuation of both the holder 13 and the forming die 14. The holder 13 moves slightly in advance of the forming die for cooperating with the stationary die to hold the component 8 firmly therein. Thereafter the cam 28 causes the forming die 14 to continue moving downwardly into cooperation with the stationary die in the manner shown in Fig. 7 whereby the vertical grooves 20 in the opposing channels 19 of the forming die are effective for bending the component leads **8*a* downward along the sides of the stationary die at right angles to the component 8**.

Figure 7:
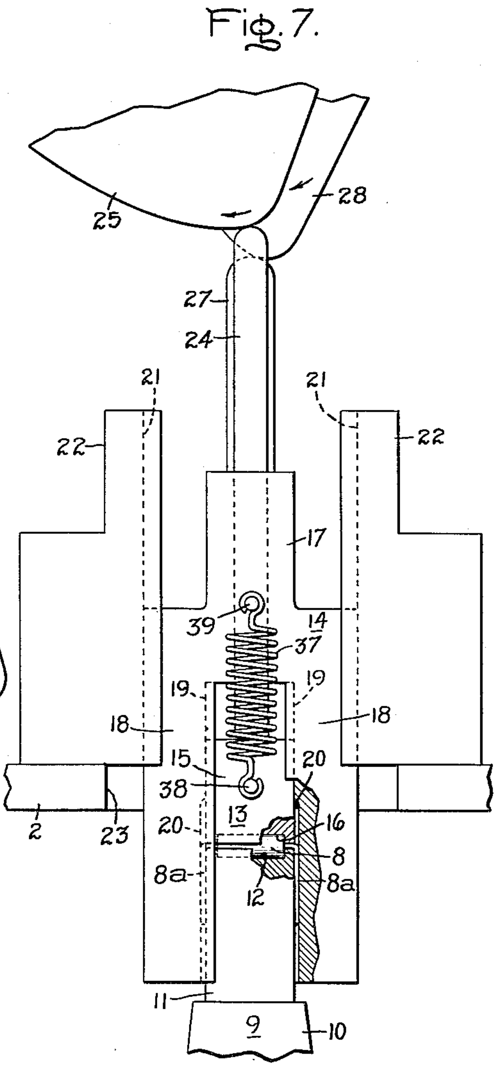
Fig. 7 is a similar view illustrating the relative disposition of parts when the forming die is actuated to bend the component leads.
Figure 6:
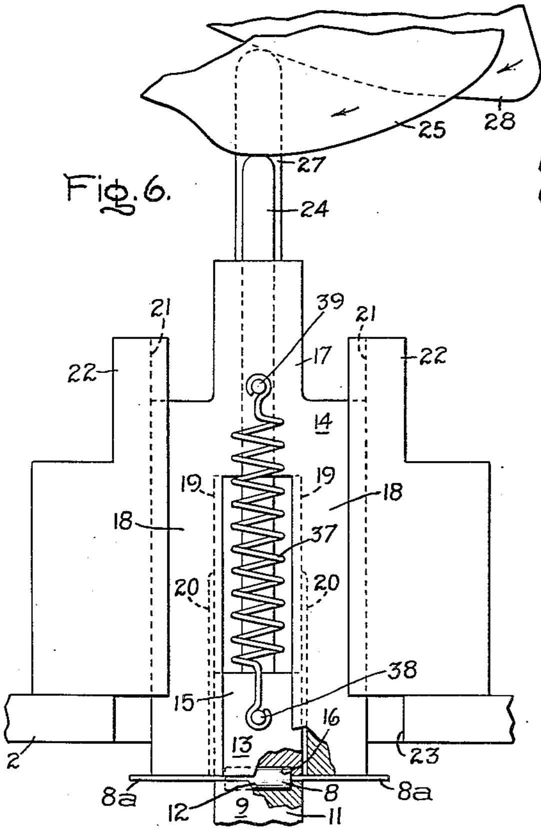
Fig. 6 is an enlarged fragmentary end view of the head illustrating the relative disposition of parts when the holding member is actuated to engage the stationary die.
Figure 8:
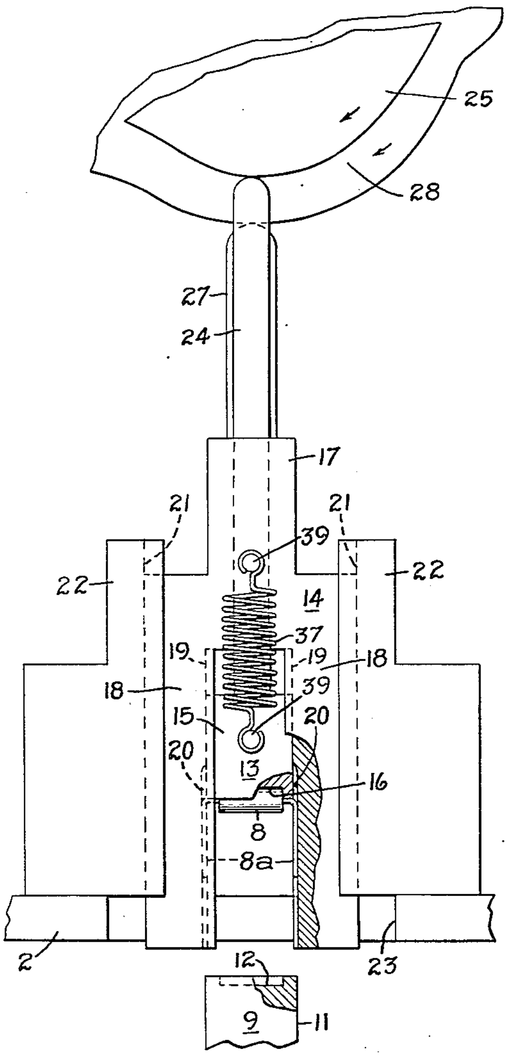

Continued rotation of the cams 25 and 28 to the position thereof shown in Fig. 8 causes both the holder 13 and the forming die 14 to retract or move up substantially concomitantly from the stationary die in the same relative positions as in Fig. 7 to the position of Fig. 8. When the holder 13 and the forming die 14 are retracted in the manner just described, the component 8 is lodged in the forming die and moves therewith to the position of Fig. 8. This is caused by frictional engagement between the bent leads **8*a* and the grooves 20** in the forming die, resulting from the inherent resilience of the lead material and the tendency for the bent leads to move outwardly in resistance to the bending thereof.

Thereafter the cam 7 is effective for moving the head 1 with the formed component 8 lodged in the forming die 14 to position C of Fig. 1. In position C the head 1 is disposed over a utilization device in the form of a chassis 43 adapted for having the formed leads of the component inserted in suitable apertures in the chassis. For example, as seen in Fig. 9 when the head 1 is positioned at C one of the leads **8*a* of the component 8 carried by the forming die may be axially aligned with an aperture 44 formed in the chassis for receiving that lead to ground it to the chassis. The other lead 8*a* may be axially aligned with an aperture 45 formed in an insulative disc 46 secured beneath an enlarged aperture 47** in the chassis and whereas a conductor may be electrically connected to this lead.

Following positioning of the head 1 at C and alignment of the bent leads **8*a* with suitable apertures in the chassis 43, in the manner just described, the cam 25 is effective in the manner seen in Fig. 9 for again actuating the holder 13 downward relative to the forming die 14, whereby the formed component 8 is ejected from the forming die for insertion into the apertures 44 and 45 in the chassis 43** positioned at C.

As seen in Fig. 1 chassis are adapted for being positioned seriatim at position C for operation thereon by the head 1 by means of an indexing head generally designated 48. The indexing head 48 is arranged for cyclical operation in timed relationship with the movement of head 1. Following operation of the head 1 at position C in the above described manner for inserting a component in a chassis 43, the indexing head 48 will move another chassis into position C and the cam 7 will be effective for returning the head 1 to position A, all in preparation for a repeat cycle of the above described operation of forming and placing a component 8.

While I have shown and described a specific embodiment of my invention I do not desire my invention to be limited to the particular form shown and described and I intend by the appended claims to cover all modifications within the spirit and scope of my invention.

What I claim as new and desire to secure by Letters Patent of the United States is:

1. An arrangement for forming and placing components including wire leads extending from the ends thereof comprising; a stationary die adapted for receiving a component, a forming die for cooperating with said stationary die to bend said leads, said forming die being adapted for having the formed component lodged therein by frictional engagement therewith of the bent leads, and means for positioning said forming die while carrying said component to align said bent leads with a utilization device adapted for receiving said leads.

2. An arrangement for forming and placing components including wire leads extending from the ends thereof comprising; a stationary die adapted for receiving a component, a forming die for cooperating with said stationary die to bend said leads, said forming die being adapted for having the formed component lodged therein by frictional engagement therewith of the bent leads, and means for positioning said forming die while carrying said component to align said bent leads with a utilization device adapted for receiving said leads, and means for ejecting said component from said forming die and inserting said leads into said utilization device.

3. An arrangement for forming and placing components including wire leads extending from the ends thereof comprising; a stationary die adapted for receiving a component, a forming die for cooperating with said stationary die to bend said leads, means for holding said component on said stationary die during forming, said forming die being adapted for having the formed component lodged therein by frictional engagement therewith of the bent leads, means for positioning said forming die while carrying said component to align said bent leads with a utilization device adapted for receiving said leads, and means for actuating said holding means to eject said component from said forming die and to insert said leads into said utilization device.

4. An arrangement for forming and placing components including wire leads extending from the ends thereof comprising; a stationary die adapted for receiving a component, a forming die for cooperating with said stationary die to bend said leads, a holding member slidably carried by said forming die, means for actuating said holding member relative to said forming die for cooperating with said stationary die in advance of said forming die to hold said component during forming, said forming die being adapted for having the formed component lodged therein by frictional engagement therewith of the bent leads, means for positioning said forming die while carrying said component to align said bent leads with a utilization device for receiving said leads, and means for again actuating said holding member relative to said forming die to eject said component from said forming die and to insert said leads into said utilization device.

5. An arrangement for automatically forming and placing components including wire leads extending from the ends thereof comprising; a head, means for moving said head between component forming and placing positions, a stationary die at said forming position adapted for receiving a component, a forming die carried by said head, means for actuating said forming die when said head is at said forming position to effect cooperation with said stationary die for bending the leads on said component, a holding member carried by said forming die, means for actuating said holding member relative to said forming die for cooperation with said stationary die in advance of said forming die to hold said components during forming, means for retracting said forming die and holding member substantially concomitantly, said forming die being adapted when retracted for having the formed component lodged therein by frictional engagement therewith of the bent leads, said forming die being effective when said head is moved to said placing position for carrying said component and aligning said bent leads thereof with a utilization device adapted for receiving said leads at said placing position, and means for again actuating said holding member relative to said forming die to eject said component from said forming die and to insert said leads into said utilization device.

6. An arrangement for automatically forming and placing components including wire leads extending from the ends thereof comprising; a head, means for moving said head between component forming and placing positions, a stationary die at said forming position adapted for receiving a component, a forming die slidably arranged on said head, said forming die being adapted for cooperating with said stationary die and including spaced portions for straddling said stationary die, means for actuating said forming die at said forming position to effect cooperation with said stationary die for bending the leads of said component, a holding member slidably arranged between said spaced portions of said forming die, means for actuating said holding member relative to said forming die for cooperating with said stationary die in advance of said forming die to hold said component during forming, means for retracting said forming die and holding member substantially concomitantly, said forming die being adapted when retracted for having the formed component lodged therein between said spaced apart portions by frictional engagement therewith of said bent leads, said forming die being effective when said head is moved to said placing position for carrying said component and aligning said bent leads thereof with a utilization device adapted for receiving said leads at said placing position, and means for again actuating said holding member relative to said forming die to eject said component from said forming die and to insert said leads into said utilization device.

7. An arrangement for automatically forming and placing components including wire leads extending from the ends thereof comprising; a head, means for cyclically moving said head between component forming and placing positions, means for cyclically disposing component utilization devices at said placing position when said head is at said placing position, a stationary die at said forming position adapted for receiving a component to be formed, a forming die carried by said head, means for actuating said forming die when said head is at said forming position to effect cooperation with said stationary die for bending the leads on said component, a holding member carried by said forming die, means for actuating said holding member relative to said forming die for cooperation with said stationary die in advance of said forming die to hold said component during forming, means for retracting said forming die and holding members substantially concomitantly, said forming die being adapted when retracted for having the formed component lodged therein by frictional engagement therewith of the bent leads, said forming die being effective when said head is moved to said placing position for carrying said component and aligning said bent leads thereof with a utilization device at said placing position, and means for again actuating said holding member relative to said forming die to eject said component from said forming die and to insert said leads into said utilization device.

8. An arrangement for automatically forming and placing components including wire leads extending from the ends thereof comprising; a head, means for cyclically moving said head between component forming and placing positions, means for cyclically disposing component utilization devices at said placing position, a stationary die at said forming position adapted for receiving a component to be formed, a forming die slidably arranged on said head, said forming die being adapted for cooperating with said stationary die and including spaced portions for straddling said stationary die, means for actuating said forming die at said forming position to effect cooperation with said stationary die for bending the leads of said component, a holding member slidably arranged between said spaced portions of said forming die, means for actuating said holding member relative to said forming die for cooperation with said stationary die in advance of said forming die to hold said component during forming, means for retracting said forming die and holding member substantially concomitantly, said forming die being adapted when retracted for having the formed component lodged therein between said spaced portions by frictional engagement therewith of the bent leads, said forming die being effective when said head is moved to said placing position for carrying said component and aligning said bent leads thereof with a component utilization device at said placing position, and means for again actuating said holding member relative to said forming die to eject said component from said forming die and to insert said leads into said component receiving means.

9. An arrangement for placing components including spaced substantially parallel leads in utilization devices including spaced apertures adapted for receiving said leads comprising; means for moving a utilization device along a horizontal path into a component placement position, a member movable in a horizontal plane into and out of an operating position vertically disposed relative to said placement position and adapted for holding a component with the leads thereof in alignment with apertures in a utilization device in said placement position, and means carried by said member and effective when said member is in said operating position for ejecting said component from said member thereby to insert said leads into said apertures in said utilization device.

10. An arrangement for placing components including spaced susbtantially parallel leads in utilization devices including spaced apertures adapted for receiving said leads comprising; means for moving a utilization device along a predetermined path into a component placement position, a female member adapted for receiving a component, means for displacing said female member in a plane extending substantially parallel to said predetermined path thereby to align the leads of a component therein with apertures in a utilization device at said placement position, and means for ejecting said component from said female member thereby to insert said leads into said apertures in said utilization device.

11. An arrangement for automatically placing components including spaced substantially parallel leads in utilization devices including spaced apertures adapted for receiving said leads comprising; means cyclically operative for moving utilization devices along a predetermined path into a component placement position, a member movable laterally in a plane susbtantially parallel to said predetermined path and into and out of an operating position above said placement position, said member being adapted for cyclically receiving components outside of said operating position and positioning said components with the leads thereof in alignment with apertures in a utilization device in said placement position, and cyclically operative means carried by said member and effective when said member is in said operating position for ejecting said components from said member thereby to insert said leads into said apertures in said utilization device.

12. An arrangement for forming and placing components including wire leads extending from the ends thereof comprising; a stationary male die adapted for receiving a component, a moveable female die for cooperating with said male die to bend said leads, said female die being adapted for having the formed components lodged therein by frictional engagement therewith of the bent leads, and means for positioning said female die laterally relative to said male die while carrying said component to align said bent leads with a utilization device adapted for receiving said leads.

13. An arrangement for forming and placing components including wire leads extending from the ends thereof comprising; a stationary male die adapted for receiving a component, a moveable female die for cooperating with said male die to bend said leads, said female die being adapted for having the formed components lodged therein by frictional engagement therewith of the bent leads, means for positioning said female die laterally relative to said male die while carrying said component to align said bent leads with a utilization device adapted for receiving said leads, and means for ejecting said component from said female die and inserting said leads into said utilization device.

14. An arrangement for forming and placing components including wire leads extending from the ends thereof comprising; a stationary male die adapted for receiving a component, a movable female die for cooperating with said male die to bend said leads, means for holding said component on said male die during forming, said female die being adapted for having the formed component lodged therein by frictional engagement therewith of the bent leads, means for positioning said female die laterally relative to said male die while carrying said component to align said bent leads with a utilization device adapted for receiving said leads, and means for actuating said holding means for ejecting said component from said female die and to insert said leads into said utilization device.

15. An arrangement for forming components including wire leads extending from the ends thereof and placing said components in utilization devices including spaced apertures adapted for receiving said leads comprising; means for moving a utilization device into a component placement position, a stationary male die adapted for receiving a component, a moveable female die for cooperating with said male die to bend said leads, said female die being adapted for having the formed components lodged therein by frictional engagement therewith of the bent leads, means for angularly displacing said female die thereby to align the leads of a component therein with apertures in a utilization device at said placement position, and means for ejecting said component from said female die thereby to insert said leads into said apertures in said utilization device.

16. An arrangement for automatically forming components including wire leads extending from the ends thereof and placing said components in utilization devices including spaced apertures adapted for receiving said leads comprising; means cyclically operative for moving utilization devices into a component placement position, a stationary male die adapted for cyclically receiving a component, a moveable female die cyclically operative for cooperating with said male die to form said component, said female die being adapted for having the formed component lodged therein by frictional engagement therewith of the bent leads, and means cyclically operative for positioning said female die while carrying said component to align the leads of said component with apertures in a utilization device at said placement position, and cyclically operative means for ejecting said components from said female member at said placement position thereby to insert said leads into said apertures in said utilization device.

References Cited in the file of this patent

UNITED STATES PATENTS

| | | |
|---|---|---|
| 699,565 | Pugh | May 6, 1902 |
| 728,201 | Campbell | May 19, 1903 |
| 957,420 | Hall | May 10, 1910 |
| 1,834,733 | Poole | Dec. 1, 1931 |
| 1,874,622 | Ranney | Aug. 30, 1932 |
| 2,450,920 | Shand | Oct. 12, 1948 |
| 2,537,480 | Nasmith | Jan. 9, 1951 |
| 2,653,631 | Vaughan | Sept. 29, 1953 |